United States Patent

Retter et al.

[11] Patent Number: 5,376,764
[45] Date of Patent: Dec. 27, 1994

[54] THREE-WAY SWITCH

[75] Inventors: Dale J. Retter, Scottsdale; Anthony J. Van Zeeland, Mesa, both of Ariz.

[73] Assignee: Industrial Innovations, Inc., Scottsdale, Ariz.

[21] Appl. No.: 144,205

[22] Filed: Oct. 27, 1993

[51] Int. Cl.$^5$ .............................................. H01H 1/24
[52] U.S. Cl. .................................. 200/245; 200/332; 200/335; 200/1 B
[58] Field of Search .............. 200/245, 332, 335, 553, 200/558, 561, 1 B; 250/229

[56] References Cited

U.S. PATENT DOCUMENTS

| | | | |
|---|---|---|---|
| 2,360,128 | 10/1944 | Hausler | 200/1 B |
| 2,469,976 | 5/1949 | Miller | 200/1 B |
| 2,813,160 | 11/1957 | Tong | 200/1 B |
| 5,272,383 | 12/1993 | Umemura et al. | 250/229 |

Primary Examiner—Henry J. Recla
Assistant Examiner—David J. Walczak
Attorney, Agent, or Firm—LaValle D. Ptak

[57] ABSTRACT

A three-position floating beam armature switch includes a hollow housing, in which a floating beam armature is resiliently biased toward the closed top of the housing. An operator member is carried by the housing to apply a predetermined force to the armature; so that a first end of the armature initially moves toward the bottom of the housing by pivoting the armature about its second end. Continued application of additional force by the operator member, causes the armature to pivot about the first end; so that the second end then moves toward the bottom of the housing. With both the first and second ends at the bottom of the housing, the third position of the switch is attained. Release of force by the operator member allows the floating beam armature once again to be biased toward the top of the housing to the initial position.

17 Claims, 2 Drawing Sheets

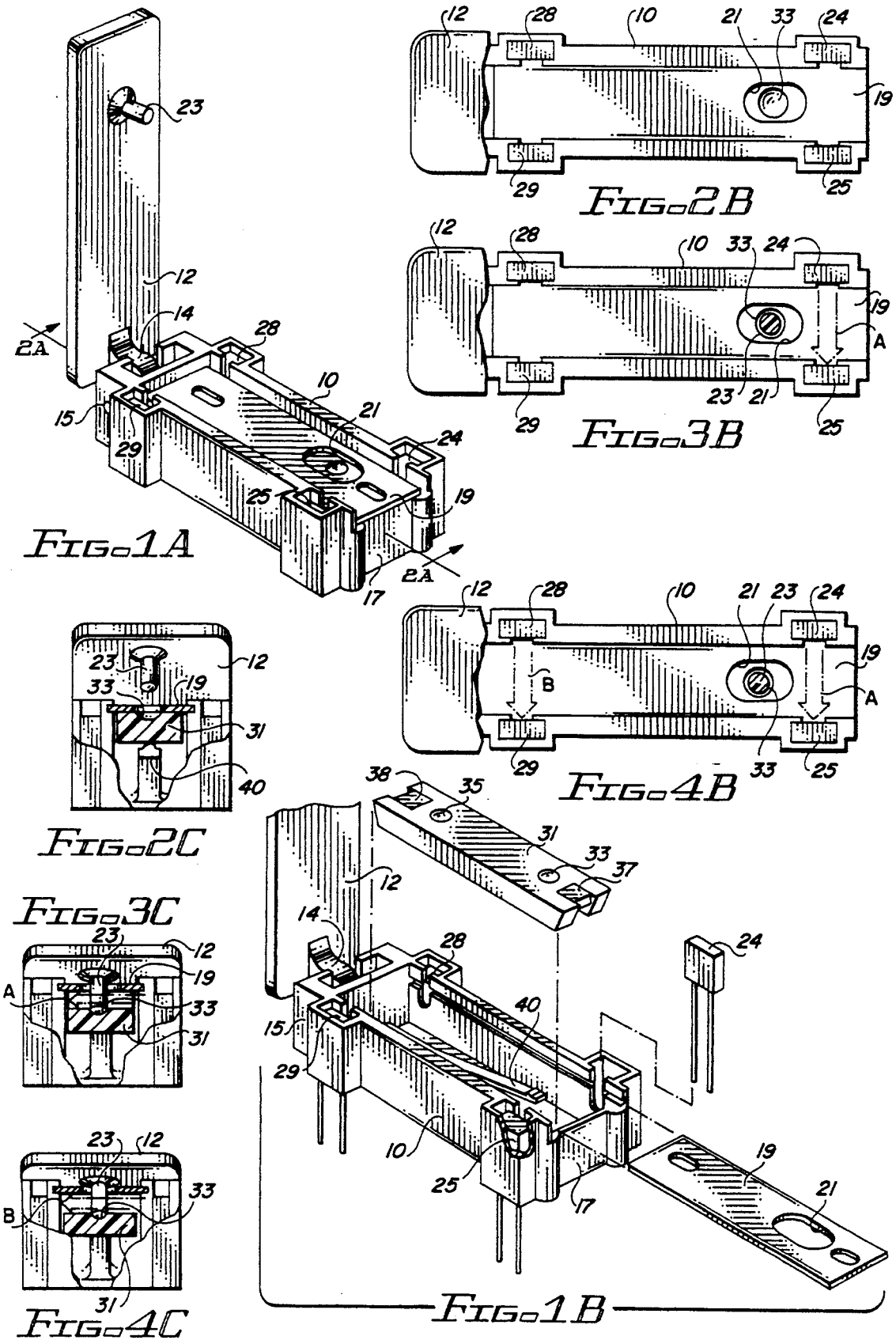

THREE-WAY SWITCH

BACKGROUND

Applications exist for multiple position switches to effect various types of operations. One such application is in conjunction with the keys of a computer or typewriter. In the relaxed position (when the key is not depressed) the first switch position, typically the "off" position, is attained. Depression of the key to a first distance or by means of a first force generally causes the operation of the typewriter or computer to form a particular symbol associated with that key. In many computer keyboards and typewriter keyboards, further depression of the key, usually with a greater force, causes the computer or typewriter to continuously repeat the symbol represented by the key. This constitutes the third state of operation of such a switch. Other applications exist, where a first position of the switch generally is the "off" position; the second position constitutes a first output, which may be utilized for any purpose, and a third position constitutes the third output, which, again, may be utilized for yet another purpose.

Frequently, three-position switches are provided with switch operators which have a neutral or central point. The operator is moved in one direction from the central point for the second position, and is moved in the opposite direction from the central point to effect the third position or operation from the switch. Such switches either use a slide mechanism or a rocking toggle lever to effect the desired operation. A disadvantage of such switches is that to move from the second position to the third position, or vice-versa, it is necessary always to go through the initial or rest position of the switch, which typically is the center location (whether a slide switch or a rocking toggle is utilized).

Many multiple position switches employ some type of spring bias to return the switch to its starting condition (typically, the off position) whenever the operating lever or plunger is released, that is when force no longer is applied to the operating lever or plunger. To accomplish this, it usually is necessary to employ one or more springs as part of the switch assembly. Thus, even a relatively simple switch operator involves a number of different parts, which require several assembly steps in the manufacture of the switch. This increases the complexity of the switch, increases its cost of manufacture, and also increases the chance for a failure of one or more of these parts in the continued life of the switch.

The patent to Wintriss U.S. Pat. No. 3,263,044 is directed to a three-position switch in which a floating bar made of metal is moved by plungers from a rest position to an operated position. One of the switch mechanisms disclosed in this patent uses three spaced magnets and a fulcrum to effect the positioning of the metal bar under the operation of two different plungers. The first plunger moves the bar from a rest position to a first operating position interconnecting a pair of the magnets. Additional downward pressure on the plunger has no further effect on the operation. To reset the switch, a second plunger is provided. That plunger then is depressed to snap the floating bar to another position, where the opposite end is attracted to one magnet and moved away from another magnet. Release of both of the plungers then allows the metal bar to return to its original position. Because magnets are located on both sides of the switch mechanism, two plungers are required. This switch does provide a sharp snap action operation, amounting to a three-position switch; but it relatively complex, and requires dual plungers or operating members in order to effect its operation.

It is desirable to provide a simplified three-position switch which overcomes the disadvantages of the prior art.

SUMMARY OF THE INVENTION

It is an object of this invention to provide an improved switch.

It is another object of this invention to provide an improved manually operated, multiple position switch.

It is an additional object of this invention to provide an improved three-position switch.

It is a further object of this invention to provide an improved three-position switch using a floating beam armature, which is displaced from a rest position in response to an operating force, causing it to pivot about one end, with continued application of operating force to the beam armature causing it to pivot about its other end to a third position of operation.

In accordance with a preferred embodiment of this invention, a three-position switch comprises a hollow housing member. A floating beam armature is located in the housing, and it extends between the ends of the housing. A resilient anchor or bias, located at each end of the floating beam, causes it to be biased toward the top of the housing. An operator member is carried by the housing for applying force to the armature; so that upon application of a predetermined force, the armature pivots at a first end to move the second end toward the bottom of the housing. Continued application of force by the operator member to the armature causes the armature to pivot at the second end; so that the first end which forms the first pivot moves toward the bottom of the housing. Both the first and second ends of the floating armature then are located adjacent the bottom of the housing until release of force by the operator member, whereupon the floating beam armature is returned to its rest position at the top of the housing.

BRIEF DESCRIPTION OF THE DRAWING

FIG. 1A is a top perspective view of a preferred embodiment of the invention;

FIG. 1B is a partially exploded top perspective view of the embodiment shown in FIG. 1A, illustrating details of the invention;

FIGS. 2A, 2B and 2C, respectively, illustrate a cross-sectional side view, atop partially broken-away view, and a front cross-sectional view of the embodiment of FIGS. 1A and 1B in a first position of operation;

FIGS. 3A, 3B and 3C illustrate, respectively, a cross-sectional side view, a partially broken away top view, and a cross-sectional end view of the embodiment of the invention in a second position of operation;

FIGS. 4A, 4B and 4C illustrate, respectively, a cross-sectional side view, a partially broken-away top view, and a cross-sectional end view of the invention in a third position of operation.

DETAILED DESCRIPTION

Figure 2A:
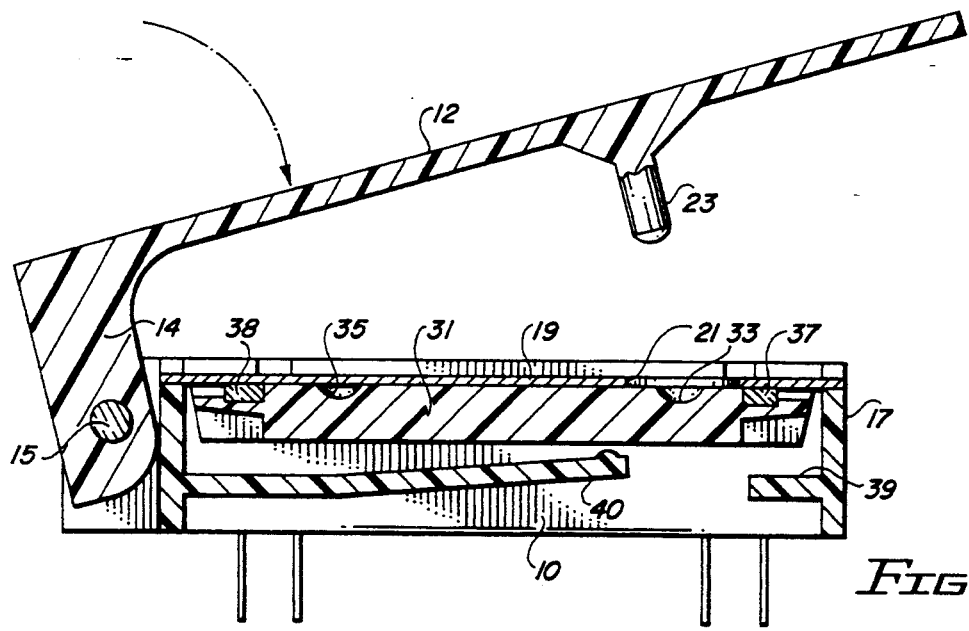

Reference now should be made to the drawings, in which the same reference numbers are used throughout the different figures to designate the same components. FIGS. 1A and 1B, respectively, show a top perspective view of the preferred embodiment of the invention and an exploded top perspective view of that embodiment. As illustrated in these figures, the three-way floating beam switch of the preferred embodiment is constructed in a hollow housing 10 of a generally elongated rectangular shape.

At the left-hand of the housing 10, as viewed in FIGS. 1A and 1B, an operating lever 12 is pivotally hinged on a pivot 15 passing through the end of the housing 10 and a downwardly extending extension 14, located on the underside of the operating lever 12. The lever 12 overlies the top of the housing 10 when the switch is in operation, as illustrated most clearly in FIGS. 2A, 3A and 4A. The right-hand end 17 of the housing 10 (once again, as viewed in FIGS. 1A and 1B) terminates at a point which is below the upper edge of the sides of the housing 10. Extending rearwardly from this edge are a pair of shallow elongated parallel slots, which extend from the front edge to the rear of the housing 10. A metal cover plate 19 slides into these slots and overlies the interior of the switch assembly, as illustrated in FIGS. 1B through 4C. Before the metal plate 19, however, is inserted into these slots, an elongated rectangular beam armature 31 is placed in the housing.

The beam armature 31 has a pair of circular depressions 33 and 35 located on its top surface. The beam armature 31 may be inserted into the housing with either end oriented toward the front 17, and the relative locations of the depressions 33 and 35 are the same. A pair of magnets 37 and 38 are secured at the opposite ends near the upper surface of the beam armature 31 by any suitable means, such as adhesive. The beam armature 31 rests against a resilient finger 40, which is integrally formed with all of the rest of the housing 10, to provide an upward bias or restoring force to the bottom of the beam armature 31 when the switch is assembled.

When the plate 19 is placed over the beam armature 31, an aperture 21 adjacent the right-hand end of the plate 19 (as shown in FIGS. 1A through 4C) overlies the depression 33 on the beam armature 31. The location of this aperture and the location of the underlying depression 33 on the top of the beam 31 aligns with a projection 23 on the operating lever 12 when the lever 12 is rotated clockwise (as viewed in FIGS. 2A, 3A and 4A), to cause the end of the projection 23 to extend through the aperture 21 in the top plate 19 to engage the depression 33 in the top of the floating beam armature 31.

The housing 10 also is formed with two pairs of opposing spaced pockets adjacent each end. In the embodiment shown in the drawings, these pockets are used to house infrared or light-emitting diodes 24 and 28 on one side for projecting light across the width of the housing 10 to infrared or light-responsive elements 25 and 29, respectively, located in the pockets on the opposite side of the housing 10.

When the beam armature 31 is in its uppermost position (its relaxed or unoperated position), as illustrated in FIG. 2A, the thickness of the beam armature 31 is sufficient to block the light path between the respective light transmitting element 24 and receiving element 25, and the light transmitting element 26 and receiving element 29. In this position, the two magnets 37 and 38 provide an elastic anchor or bias to hold the beam 31 against the plate 19, as illustrated in FIGS. 2A and 2C. As is also most readily apparent from an examination of FIG. 2A, the biasing spring 40 presses upward on the bottom of the beam 31 to assist in the restoration of the beam armature 31 to the position shown in FIG. 2A upon any subsequent release of the operating lever 12.

Figure 3A:
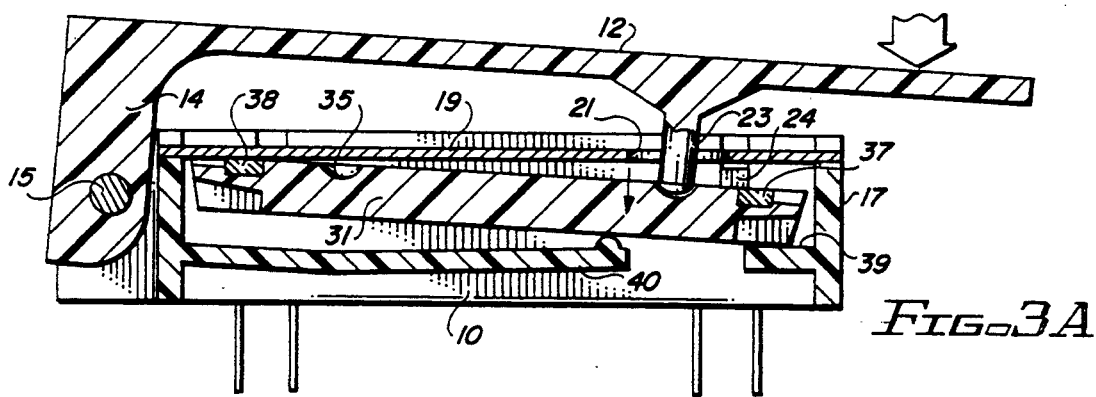
Figure 4A:
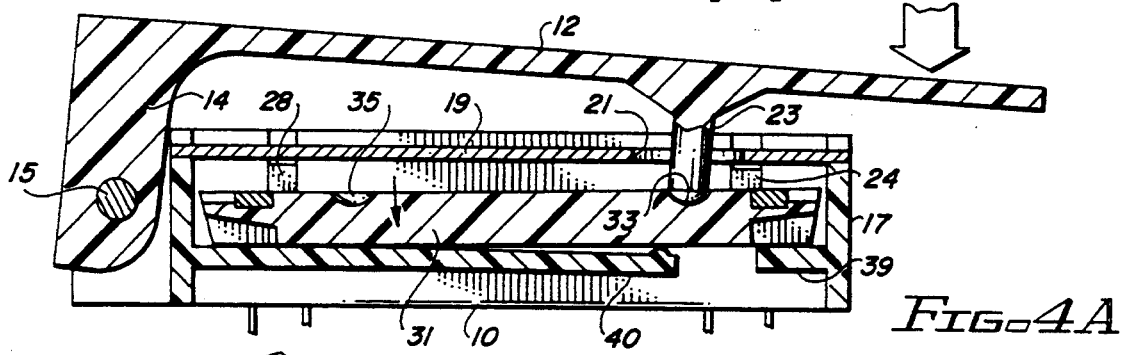

In operating the three-position switch to its second position (the first position being shown in FIG. 2A), a predetermined force is exerted on the top of the operating lever 12 in the direction of the arrow indicated in FIG. 3A. Since this force is applied near the end of the beam armature 31 which has the magnet 37 in it, the attraction between the magnet 37 and the plate 19 is broken by this force. The beam armature 31 pivots about its left end, with the magnet 38 holding the left end of the beam armature 31 (as shown in FIGS. 2A, 3A and 4A) against the plate 19. This force is applied to press the right-hand end of the beam armature 31, as shown in FIG. 3A, downwardly into engagement with a shelf 39 in the bottom of the housing 10. With the floating beam armature 31 of the switch depressed to the position shown in FIG. 3A, the light path between the light-emitting diode or infrared transmitter 24 and its receiver 25 is opened, as illustrated in FIG. 3A, and as depicted by the arrow A in FIGS. 3B and 3C. When this is done, the response of the receiving element 25 then is used as an indication of the position of the operating lever 12 of the beam switch. A pre-established force is required to move the switch from the position shown in FIG. 2A to the one shown in FIG. 3A. The amount of this force is dependent upon the magnetic attraction between the magnet 37 and the plate 19 and upon the location of the depression 33 from the pivot at the magnet 38.

Continued depression of the operating lever 12 in the direction of the arrow shown in FIGS. 3A and 4A, with additional force, then causes the floating beam armature 31 to pivot about its right-end on the shelf or projection 39 to break the attraction between the magnet 38 and the plate 19, and cause the beam armature 31 to assume the position shown in FIG. 4A. In this position, both of the light paths between the light transmitting elements or infrared transmitting elements 24 and 28 and the respective receiving elements 25 and 29 are exposed, as illustrated in FIG. 4A, and as shown by the arrows A and B in FIG. 4B and by the arrow B in FIG. 4C. It is to be noted that when the beam armature 31 is depressed to either of the two operating positions shown in FIGS. 3A and 4A, it also deflects the return spring 40, as illustrated in these figures.

It is to be noted that when the light paths A or B, or both of them, are opened by operating the beam armature to the two different positions shown in FIGS. 3A and 4A, the sensing of the position of the beam switch then can be used in any electrical circuit to bring about the desired results intended from the operation of the switch. The applications are numerous, and are not important to an understanding of the switch operation itself. For that reason, the electrical interconnections and particular applications of the responses to the opening and blocking of the light paths A and B are not necessary here.

Upon release of the force indicated by the arrows in the upper right-hand corners of FIGS. 3A and 4A, the magnetic attraction between the magnets 37 and 38 and the plate 19 pulls the beam armature 31 back into its original rest position, illustrated in FIG. 2A. The resilient spring 40 assists in returning the armature 31 to this position. The spring 40, however, could be eliminated, provided the magnetic attraction between the magnets 37 and 38 and the plate 19 is sufficient to attract the armature 31 to the plate 19 from its lowermost position, shown in FIG. 4A. It is possible to use weaker magnets, however, when a relatively weak resilient spring 40 is employed in the device.

It also should be noted that the amount of force which is required to operate the beam switch to the 5 different positions shown in 3A and 4A can be varied by varying the relative strengths of the magnets 37 and 38 and, as described above, by changing the position of the engagement of the operating projection 23 with the top of the beam armature 31 along its length.

While an infrared or optical pathway is illustrated for detecting the position of the floating beam armature 31, other types of sensing units may be employed. For example, a mechanical electrical switch, consisting of a pair of spaced conductive contacts located on the projection or ledge 39 and bridged by a suitable conductive strip on the bottom of the right-hand end of the floating beam armature 31, could be used to indicate the position shown in FIG. 3A. A similar switch, contacted by the left-hand end of the beam armature 31 when it attains the position shown in FIG. 4A, also could be employed. In such case, the optical or infrared beam interruption which has been described above no longer would be necessary, since actual mechanical switch closures would be substituted. In addition, because magnets 37 and 38 are used in the device at opposite ends of the floating beam armature 31, a magnetic sensing switch also could be employed, either in the form of a reed switch or other type of magnetically responsive device. The particular type of sensor which is used to provide an indication of the position of the two different ends of the floating beam armature 31 is not important. Various types of sensors can be employed without departing from the functional operation of the mechanism which is illustrated and which has been described above.

Figure 5:
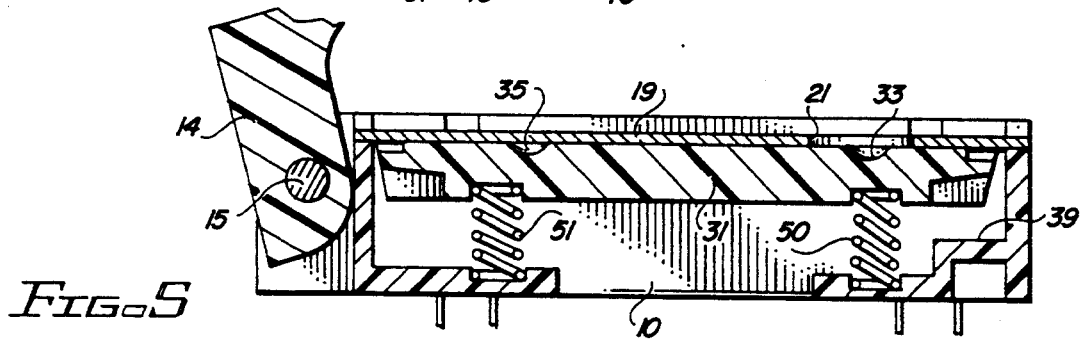
FIG. 5 is a cross-sectional side view of an alternative embodiment of the invention.

FIG. 5 illustrates an alternative embodiment from the one which has been described above in conjunction with FIGS. 1A through 4C. In FIG. 5, the apparatus is substantially the same as the one already described. The magnets 37 and 38, however, no longer are used in the beam armature 31. Instead, the beam armature has a pair of spaced recesses in the bottom located adjacent the right-hand and left-hand ends. These recesses receive the upper ends of respective coil springs 50 and 51, the opposite ends of which engage corresponding recesses in the bottom of the housing 10. The springs 50 and 51 resiliently bias the beam armature 31 to the rest position shown in FIG. 5.

Depression of the operating lever 12 to the different positions corresponding to those shown in FIGS. 3A and 4A first causes the spring 50 to be compressed, and then the spring 51 to be compressed with the same type of operation which has been described above in conjunction with FIGS. 3A and 4A. The elastic anchoring of the floating beam 31, however, against the plate 19 now is accomplished by means of coil springs 50 and 51 rather than by magnetic forces.

Obviously, the plate 19 in the embodiment shown in FIG. 5 does not need to be made of magnetically attractive material, since no magnets are employed in this version. In all other respects, the operation of the device constructed in accordance with the illustration in FIG. 5 is the same as the operation described above in conjunction with the embodiment of FIGS. 1A to 4C.

The foregoing description of the preferred embodiment of the invention is to be considered as illustrative, and not as limiting. Various changes and modifications will occur to those skilled in the art, without departing from the true scope of the invention; and variations which perform substantially the same function as the disclosed embodiments, in substantially the same way, to achieve substantially the same results, are covered by the invention as defined in the appended claims.

We claim:

1. An actuator for a three-position switch including in combination:
   a hollow housing member with first and second ends, first and second sides, a bottom and a top;
   a floating beam armature, having a center and first and second ends, in said housing member and extending between said first and second ends of said housing member;
   a resilient anchor at each end of said floating beam armature to bias said armature toward the top of said housing;
   an operator member carried by said housing for applying a predetermined force to said armature so that said armature pivots at the second end thereof, with the first end thereof moved into contact with the bottom of said housing, whereupon continued application of force by said operator member, greater than said predetermined force, causes said armature to pivot at the first end thereof, so that the second end of said armature moves to the bottom of said housing to locate both said first and second ends of said armature at the bottom of said housing.

2. The combination according to claim 1 wherein the top of said housing member has an aperture therein, and said operator member has an extension thereon extending through said aperture to engage said floating beam armature.

3. The combination according to claim 2 wherein the aperture in the top of said housing member is located in a position such that the extension on said operator member engages said floating beam armature at a point between the center thereof and the first end thereof.

4. The combination according to claim 3 wherein the resilient anchors at each end of said floating beam comprise first and second springs.

5. The combination according to claim 3 wherein said resilient anchor at each end of said floating beam armature comprises a magnet, and the top of said housing member includes at least a portion thereof made of magnetically attractive material located adjacent said magnets at each end of said floating beam armature.

6. The combination according to claim 5 further including a position sensor in said housing member providing a first position indication with said armature having both ends thereof biased by said resilient anchors toward the top of said housing; providing a second position indication with said armature pivoted about the second end thereof, with the first end of said armature moved to the bottom of said housing; and providing a third position indication with said armature pivoted such that the first and second ends thereof are moved to the bottom of said housing.

7. The combination according to claim 6 wherein said position sensor comprises first and second sensing elements located, respectively, adjacent the first and second ends of said floating beam armature with each of said sensing elements providing a first output, corresponding to said first position indication, with said floating beam armature biased toward the top of said housing; said first sensing element providing a second output and said second sensing element providing said first output with said floating armature having the first end thereof moved to the bottom of said housing with the second end thereof remaining biased toward the top of said housing, corresponding to said second position indication; and with said first sensing element providing said second output, and said second sensing element providing a second output with said armature moved to the bottom of said housing corresponding to said third position indication.

8. The combination according to claim 7 wherein said first and second sensing elements comprise optical sensing elements.

9. The combination according to claim 8 further including a resilient member located adjacent the bottom of said housing member for biasing said floating beam armature toward the top of said housing member upon release of force by said operator member on said armature.

10. The combination according to claim 1 wherein said resilient anchor at each end of said floating beam armature comprises a magnet, and the top of said housing member includes at least a portion thereof made of magnetically attractive material located adjacent said magnets at each end of said floating beam armature.

11. The combination according to claim 10 wherein the top of said housing member has an aperture therein, and said operator member has an extension thereon extending through said aperture to engage said floating beam armature.

12. The combination according to claim 11 wherein the aperture in the top of said housing member is located in a position such that the extension on said operator member engages said floating beam armature at a point between the center thereof and the first end thereof.

13. The combination according to claim 1 further including a position sensor in said housing member providing a first position indication with said armature having both ends thereof biased by said resilient anchors toward the top of said housing; providing a second position indication with said armature pivoted about the second end thereof, with the first end of said armature moved to the bottom of said housing; and providing a third position indication with said armature pivoted such that the first and second ends thereof are moved to the bottom of said housing.

14. The combination according to claim 13 wherein said position sensor comprises first and second sensing elements located, respectively, adjacent the first and second ends of said floating beam armature with each of said sensing elements providing a first output, corresponding to said first position indication, with said floating beam armature biased toward the top of said housing; said first sensing element providing a second output and said second sensing element providing said first output with said floating armature having the first end thereof moved to the bottom of said housing with the second end thereof remaining biased toward the top of said housing, corresponding to said second position indication; and with said first sensing element providing said second output and said second sensing element providing a second output with said armature moved to the bottom of said housing corresponding to said third position indication.

15. The combination according to claim 14 wherein said first and second sensing elements comprise optical sensing elements.

16. The combination according to claim 1 wherein the resilient anchors at each end of said floating beam comprise first and second springs.

17. The combination according to claim 1 further including a resilient member located adjacent the bottom of said housing member for biasing said floating beam armature toward the top of said housing member upon release of force by said operator member on said armature.

* * * * *